(12) United States Patent
Kawasaki et al.

(10) Patent No.: US 7,504,624 B2
(45) Date of Patent: Mar. 17, 2009

(54) CHARGED PARTICLE BEAM DEVICE

(75) Inventors: Takeshi Kawasaki, Musashino (JP);
Tomonori Nakano, Kokubunji (JP);
Michio Hatano, Tokyo (JP); Momoyo Enyama, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 346 days.

(21) Appl. No.: 11/341,663

(22) Filed: Jan. 30, 2006

(65) Prior Publication Data
US 2006/0255269 A1    Nov. 16, 2006

(30) Foreign Application Priority Data
May 13, 2005    (JP)    ............... 2005-140588

(51) Int. Cl.
*G21K 7/00*    (2006.01)
(52) U.S. Cl. .................. 250/310; 250/306; 250/311; 250/398; 250/396 R; 250/492.2
(58) Field of Classification Search ................. 250/306, 250/307, 308, 309, 491.1, 310, 311, 396 R, 250/397, 399, 396 ML, 398, 492.2
See application file for complete search history.

(56) References Cited

U.S. PATENT DOCUMENTS

| | | | | |
|---|---|---|---|---|
| 3,714,422 | A * | 1/1973 | Hosoki et al. ............... | 250/307 |
| 5,900,629 | A * | 5/1999 | Todokoro et al. ........... | 250/310 |
| 6,323,499 | B1 * | 11/2001 | Muraki et al. ......... | 250/492.22 |
| 6,552,340 | B1 * | 4/2003 | Krivanek et al. ............ | 250/310 |
| 6,627,890 | B2 * | 9/2003 | Lanio ......................... | 250/311 |
| 6,838,667 | B2 * | 1/2005 | Tsuneta et al. .............. | 250/306 |
| 6,982,427 | B2 * | 1/2006 | Kawasaki et al. ........ | 250/396 R |
| 7,135,677 | B2 * | 11/2006 | Kienzle et al. .............. | 250/310 |
| 7,173,259 | B2 * | 2/2007 | Tsai ........................ | 250/491.1 |
| 7,186,975 | B2 * | 3/2007 | Ishitani et al. .............. | 250/310 |
| 2002/0047096 | A1 * | 4/2002 | Goto ....................... | 250/492.2 |
| 2003/0001102 | A1 | 1/2003 | Zach | |
| 2003/0098415 | A1 * | 5/2003 | Matsuya et al. ............. | 250/306 |
| 2003/0122076 | A1 * | 7/2003 | Matsuya et al. ............. | 250/311 |
| 2004/0029046 | A1 * | 2/2004 | Nagano et al. .............. | 430/296 |
| 2005/0040332 | A1 * | 2/2005 | Kochi et al. ................. | 250/310 |
| 2005/0104006 | A1 * | 5/2005 | Yoshida et al. .......... | 250/396 R |
| 2005/0211921 | A1 * | 9/2005 | Wieland et al. .......... | 250/492.2 |
| 2005/0263715 | A1 * | 12/2005 | Nakasuji et al. ....... | 250/396 ML |

FOREIGN PATENT DOCUMENTS

| | | |
|---|---|---|
| JP | 2002-124205 | 4/2002 |
| JP | 2004-355822 | 12/2004 |
| WO | WO 03/032351 | 4/2003 |

OTHER PUBLICATIONS

H. Rose, Optik 33 (1971), pp. 1 to 24.
J. Zach and M. Haider, Nuclear Instruments and Methods in Physics Research A363 (1995), pp. 316 to 325.
S. Uno, K. Honda, N. Nakamura, M. Matsuya, J. Zach Proc. Of 8APEM (2004) pp. 46 to 47.

* cited by examiner

*Primary Examiner*—Jack I Berman
*Assistant Examiner*—Michael J Logie
(74) *Attorney, Agent, or Firm*—Antonelli, Terry, Stout & Kraus, LLP.

(57) ABSTRACT

A scanning charged particle microscope which facilitates adjustment, has a deep focal depth, and is provided with an aberration correction means. The state of aberration correction is judged from a SEM image by using a stop having plural openings and the judgment result is fed back to the adjustment of the aberration correction means. A stop of a nearly orbicular zone shape is used in combination with the aberration correction means.

20 Claims, 9 Drawing Sheets

CHANGE OF SEM IMAGE BEFORE CHROMATIC ABERRATION CORRECTION

SEM IMAGE DURING CHROMATIC ABERRATION CORRECTION PROCESS

CHARGED PARTICLE BEAM DEVICE

CLAIM OF PRIORITY

The present application claims priority from Japanese application JP 2005-140588 filed on May 13, 2005, the content of which is hereby incorporated by reference into this application.

FIELD OF THE INVENTION

The present invention relates to a charged particle beam device, in particular to a scanning electron microscope, an electron beam semiconductor inspector, an electron beam semiconductor dimension measurement device, a focused ion beam device and the like, each of which has an aberration corrector.

BACKGROUND OF THE INVENTION

A scanning electron microscope (SEM) has a higher resolution than an optical microscope in the observation of the surface of an object, and hence it is widely used not only as a device for research but also as an industrial device for the dimension measurement of semiconductor wafer patterns which have increasingly been miniaturized in recent years, the observation of foreign matters on a surface and the like. In the case of the dimension measurement of a semiconductor, a high resolution of several nm at a low acceleration voltage of 1 kV or lower has increasingly been required. The resolution of a SEM depends on how to focus an electron beam into a smaller spot on the surface of a specimen, and hence it is dominated by a diffraction aberration, the chromatic aberration and the spherical aberration of an electron lens as well as the size of the electron source reduced and focused with the lens. The resolution has heretofore been improved by devising an electron optics system, in particular by increasing the reduction ratio of an electron source, optimizing the shape of the object lens by the combination of acceleration and deceleration electric fields, and thus decreasing the aberration.

However, it has already been proved by Scherzer that it is impossible to make the spherical and chromatic aberrations zero with an object lens rotationally symmetrical to the optical axis, and the improvement of a resolution by such conventional measures has been restricted from the aspects of a shape and dimension, machining accuracy, material quality, breakdown voltage and others. In view of the above situation, a method for canceling the aberration of an object lens with a chromatic and spherical aberration corrector made by combining quadrupoles and octupoles is proposed (refer to H. Rose, Optik 33 (1971), pp. 1 to 24), and a SEM having an aberration corrector has been put into practical application by Zach and others in 1995 (refer to J. Zach and M. Haider, Nuclear Instruments and Methods in Physics Research A363 (1995), pp. 316 to 325).

In the event of the actual use of an aberration corrector, the adjustment of the strength of each pole, the alignment of the poles, and the alignment of the whole system including an object lens and the aberration corrector are very important. The above document by Zach and others discloses the method of judging and adjusting the controlled variables of a multipole in consideration of the amounts, directions and symmetry of the blurring of SEM images. Further, the document of S. Uno, K. Honda, N. Nakamura, M. Matsuya, J. Zach Proc. of 8APEM (2004), pp. 46 to 47 and Published Japanese Translation of PCT No. 521801/2003 disclose the method of estimating the magnitude of various kinds of geometric aberrations by deconvolution through the Fourier transformation of plural SEM images and feeding it back to the control of a multipole. Furthermore, Published Japanese Translation of PCT No. 505899/2005 discloses the method of, in the event of astigmatic correction, modulating the beam energy of charged particles, thus obtaining scanning images, and adjusting the alignment of columns from the deviation of the images and the change of the definition. In addition, JP-A No. 355822/2004 discloses the method of applying beam scanning three times to an identical line on a specimen while changing the energy thereof, thus forming three images, and adjusting a chromatic aberration corrector from the deviation among the images and the change of the definition.

SUMMARY OF THE INVENTION

When an aberration corrector is used, how to actually adjust a multipole is important and the operation of a multipole is complicated and requires sufficient experiences. Though the aforementioned Published Japanese Translation of PCT Nos. 521801/2003 and 505899/2005 explain the operation principle of the adjustment method of an aberration corrector, they disclose neither a means of simply adjusting an aberration corrector nor a device having a configuration necessary for the means. For example, the aforementioned Published Japanese Translation of PCT No. 521801/2003 does not disclose at all the chromatic aberration correction which is necessary as the preliminary step of spherical aberration correction. Further, the aforementioned Published Japanese Translation of PCT No. 505899/2005 only describes that "astigmatism can be corrected with an astigmatic corrector" and does not disclose at all the internal configuration of the astigmatic corrector and the concrete adjustment method thereof. Furthermore, in the case of the means disclosed in JP-A No. 355822/2004, it is necessary to adjust plural images while comparing them on a display.

In view of the above situation, the object of the present invention is to provide a charged particle beam device provided with an aberration corrector which has a simpler device configuration and better operability than conventional one and is capable of correcting a chromatic aberration and/or a spherical aberration.

In a charged particle beam device having an aberration correction means, a multi-hole stop is used at the time of adjusting the aberration correction means and scanning charged particle beam images (for example, SEM images or SIM images) are formed with plurally divided beams. A specimen is scanned with plural beams and hence overlapping images are obtained. Then it is possible to correct the chromatic aberration and the spherical aberration with good operability by judging the correction state of the aberrations from the directions and symmetry of the overlapping and feeding back the judgment result to the adjustment of the aberration corrector so as to eliminate the overlapping. Further, it is possible to secure a deep focal depth by using an orbicular zone aperture the center of which is shielded in the state of the aberration correction.

The optical axis of a charged particle beam supplied from an identical charged particle source is divided into plurality, and an aberration corrector is adjusted so that the plurally divided optical axes are superimposed. Since the degree of the adjustment of the aberration corrector is visually observed, the operability of the adjustment of the aberration corrector improves outstandingly. Further, since the process of the adjustment under the visual observation can easily be replaced with image processing, the measure is suitable for the automation of the adjustment of the aberration corrector.

DETAILED DESCRIPTION OF THE PREFERRED EMBODIMENTS

An embodiment wherein the present invention is applied to a scanning electron microscope is explained hereunder. A means basically identical to the present embodiment can also be applied to another electron beam application device or a device of the beam of other charged particles such as protons and ions though the configuration of the lens and the aberration corrector is to be changed in accordance with the kinds thereof.

First Embodiment

Figure 1:
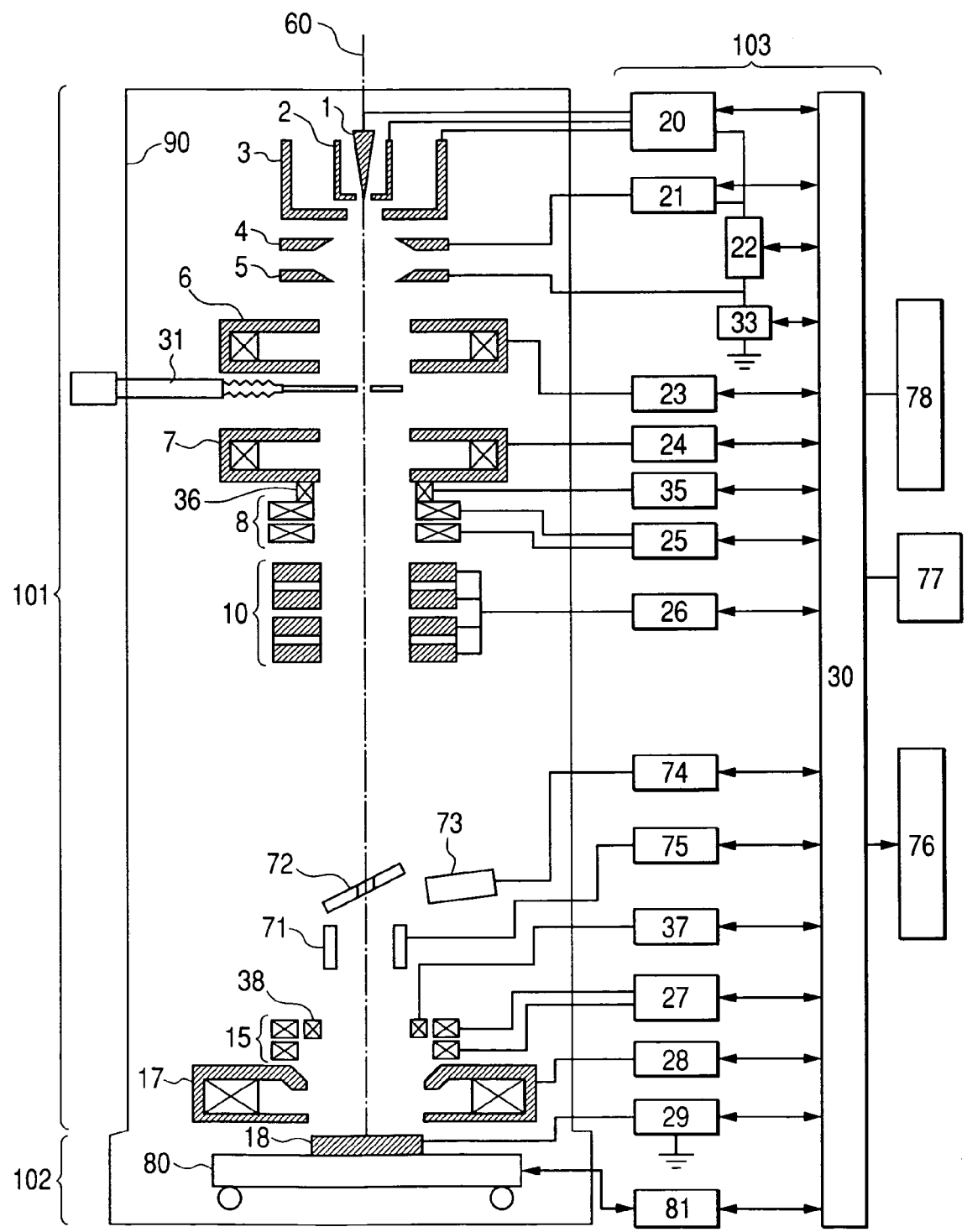
FIG. 1 shows a general configuration of a scanning electron microscope to which the present invention is applied.

FIG. 1 shows a general configuration of a scanning electron microscope as an embodiment according to the present invention. The scanning electron microscope of the present embodiment is roughly composed of: a SEM column 101 to irradiate or scan a specimen with an electron beam; a specimen chamber 102 to contain a specimen stage; a control unit 103 to control components of the SEM column 101 and the specimen chamber 102; and others. Further, to the control unit 103, connected are: a data storage 76 to store prescribed information; a monitor 77 to display obtained images; and an operator console 78 to function as a man-machine interface between the device and device users. The operator console comprises information input means such as a keyboard, a mouse and the like, for example.

Firstly, the components in the SEM column 101 are explained. A Schottky electron source 1 is an electron source which is made by diffusing oxygen, zirconium and others in a monocrystal of tungsten and makes use of the Schottky effect thereof. Then, in the vicinity of the Schottky electron source 1, a suppressor electrode 2 and an extraction electrode 3 are placed. Schottky electrons are emitted by heating the Schottky electron source 1 and applying a voltage of about +2 kV between the Schottky electron source 1 and the extraction electrode 3. A negative voltage is applied to the suppressor electrode 2 and thus the discharge of electrons from places other than the tip of the Schottky electron source 1 is inhibited. The electrons passed through the aperture of the extraction electrode 3 are accelerated and converged with an electrostatic lens comprising a first anode 4 and a second anode 5 and then enter the components of the latter stages along an optical axis 60. The electrons are converged with a first condenser lens 6, the beam diameter is regulated with a movable stop 31, and the electrons enter an aberration corrector 10 through a second condenser lens 7 and a deflector 8. Here, a multi-hole stop may be placed at the latter stage of the aberration corrector 10. The deflector 8 is adjusted so that the axis of the condenser lens 7 coincides with the axis of the aberration corrector 10. In the present embodiment, explanations are given on the basis of a quadrupole-octupole type chromatic and spherical aberration corrector 10.

A quadrupole and an octupole are formed at the respective stages of the aberration corrector 10 and twelve electrodes (magnetic poles may also be used as those) are used for that purpose. Then, it is also possible to form a dipole, a sextupole or a twelve-pole other than the quadrupole and octupole and those poles are used in order to electrically correct the field distortion caused by the assembly error of the electrodes or magnetic poles and the unevenness of the magnetic pole material. The electron beam to which the chromatic and spherical aberrations, which are to be compensated with an object lens 17, are rendered by the aberration corrector 10 is converged on a specimen 18 with the object lens 17, and the surface of the specimen is scanned with the converged spot by using a scanning deflector 15. The reference numeral 38 represents an objective aligner.

A specimen stage 80 having a specimen mounting table on which the specimen 18 is mounted is contained in the specimen chamber 102. Secondary electrons generated by electron beam irradiation pass through the object lens 17, hit a reflector 72, and generate electrons. The generated electrons are detected by a secondary electron detector 73 but it is also possible to adjust the position of the reflector 72 hit by the secondary electrons with an E×B deflector 71. The detected secondary electron signals are introduced into a control computer 30 as luminance signals synchronizing with the scanning. The control computer 30 applies appropriate processing to the introduced luminance signal information and the processed information is displayed as SEM images on the monitor 77. Only one detector is shown in the figure but it is also possible to dispose plural detectors so that images can be obtained by selecting the energy and angle distributions of reflected electrons and secondary electrons. The reflector 72 is not necessarily required if either the secondary electrons are directly accumulated to the secondary electron detector 73 with the E×B deflector 71 or a secondary electron detector of a coaxial disk shape having an aperture in the center thereof is disposed on the optical axis 60.

The control unit 103 is composed of: an electron gun power source 20; a control voltage source 21; an acceleration voltage source 22; a first condenser lens power source 23; a second condenser lens power source 24; a deflection coil power source 25; an aberration corrector power source 26; a scanning coil power source 27; an object lens power source 28; a retarding power source 29; a movable stop micromotion mechanism 32; an anastigmatic coil power source 35; an objective aligner power source 37; a secondary electron detector power source 74; an E×B deflector power source 75; a specimen stage control mechanism 81; and others. Then, they are connected to relevant components in the SEM column with signal transmission lines, electric wiring and the like.

Figure 2:
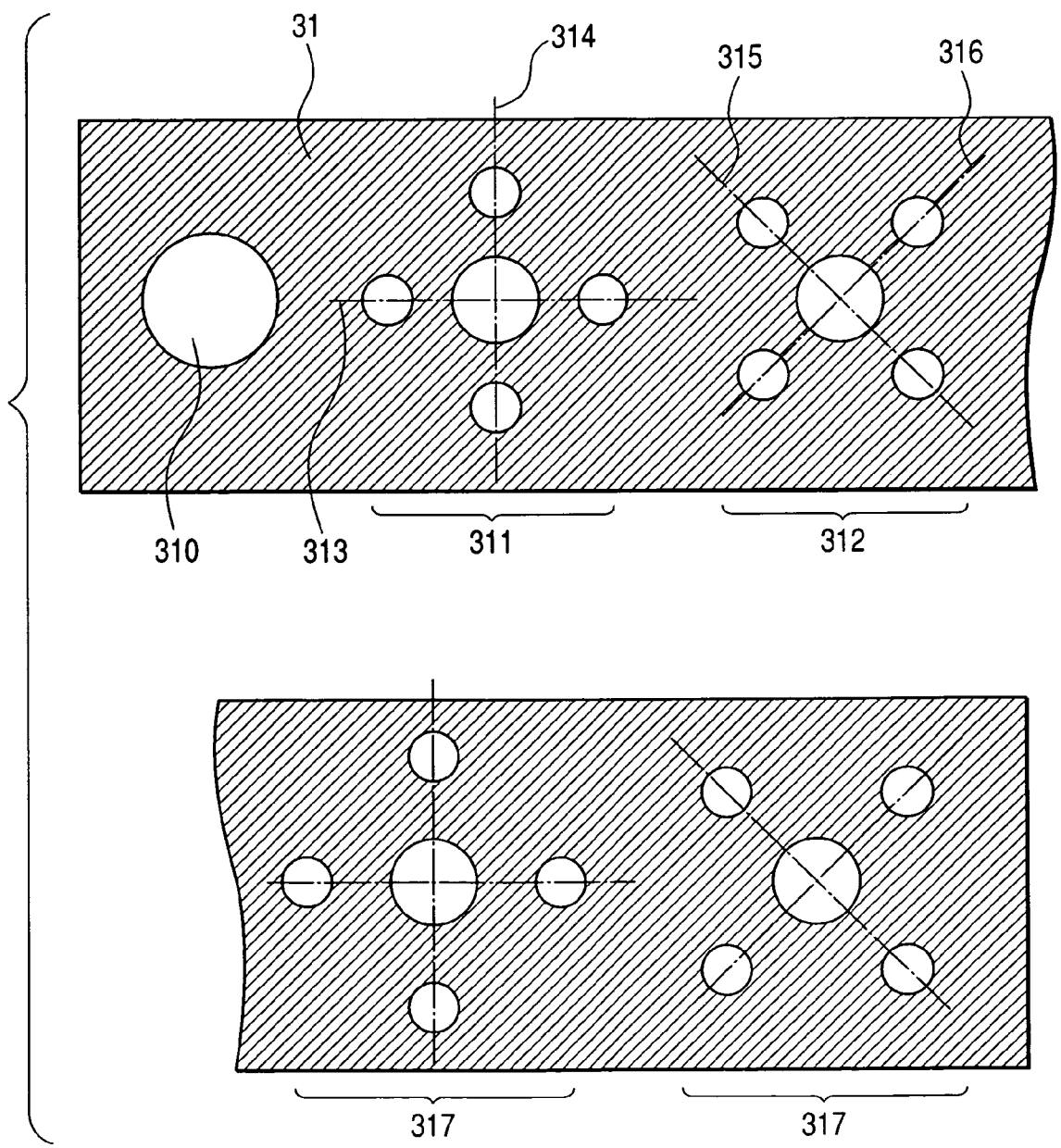
FIG. 2 shows an example of a movable stop having a single round aperture and plural-hole (five-hole) apertures according to the present invention.

FIG. 2 shows an example of the configuration of the movable stop 31. The movable stop shown in FIG. 2 has, in addition to a round aperture 310 which is usually used for regulating the amount of the beam electric current, apertures 311 and 312 for chromatic aberration correction, and apertures 317 and 318 for spherical aberration correction. Because of space limitation, the apertures 311 and 312 are shown on the upper side and the apertures 317 and 318 are shown on the lower side. However, in reality, those apertures are formed on the same single sheet. Here, each of the apertures 311, 312, 317 and 318 has plural apertures respectively and thus, in order to distinguish the former "aperture" from the latter "aperture," the apertures 311, 312, 317 and 318 are referred to as the aperture groups 311, 312, 317 and 318. The aperture group 311 is a five-hole aperture having four small holes located around the center hole at angles of 90 degrees, namely disposed at fourfold symmetrical positions. Then, the aperture group 312 is a five-hole aperture formed by rotating the small holes of the aperture group 311 at an angle of 45 degrees.

Here, if the center hole is not formed, the probe current is insufficient and that makes the adjustment difficult. This is because, in the state where the aberration is corrected, the beam passing through the center hole and the beams passing through the small holes of the periphery are converged into single spot with the object lens. Further, the reason why the peripheral small holes are smaller than the center hole is to clarify the direction of correction (the adjustment is carried out in the direction where the peripheral images coincide with the center image). By increasing the strength of the image formed by the beam passing through the center hole and reducing the strength of the images formed by the peripheral holes in the adjustment of aberration correction, the strength of the image formed by the beam passing through the center hole increases and the strength of the images formed by the peripheral holes is reduced in the obtained secondary electron images. Thereby, the visibility improves at the time of the aberration correction and it becomes easy to carry out the image processing when it is automated. The aperture groups 317 and 318 are the aperture groups used for spherical aberration correction and the distances between the center hole and the peripheral small holes are larger than those of the aperture groups 311 and 312 used for chromatic aberration correction. It is possible to make the degree of separation of the images easily visible by changing the amplitude of high voltage wobbler in the case of the adjustment of the chromatic aberration correction, but it is necessary to carry out adjustment by changing the distances between the holes in the case of the adjustment of the spherical aberration. Though it is basically desirable to prepare aperture groups having various distances between holes, a stop having large distances between holes is prepared. Meanwhile, the stop may be used for both the chromatic aberration adjustment and the spherical aberration adjustment. However, in this case, image separation caused by the spherical aberration still remains at the time of the chromatic aberration correction and hence the endpoint of the adjustment of the chromatic aberration correction is hardly identified. With a stop having small distances between holes, the image separation caused by the spherical aberration can be ignored and thus the endpoint of the adjustment of the chromatic aberration correction is easily identified.

Figure 3:
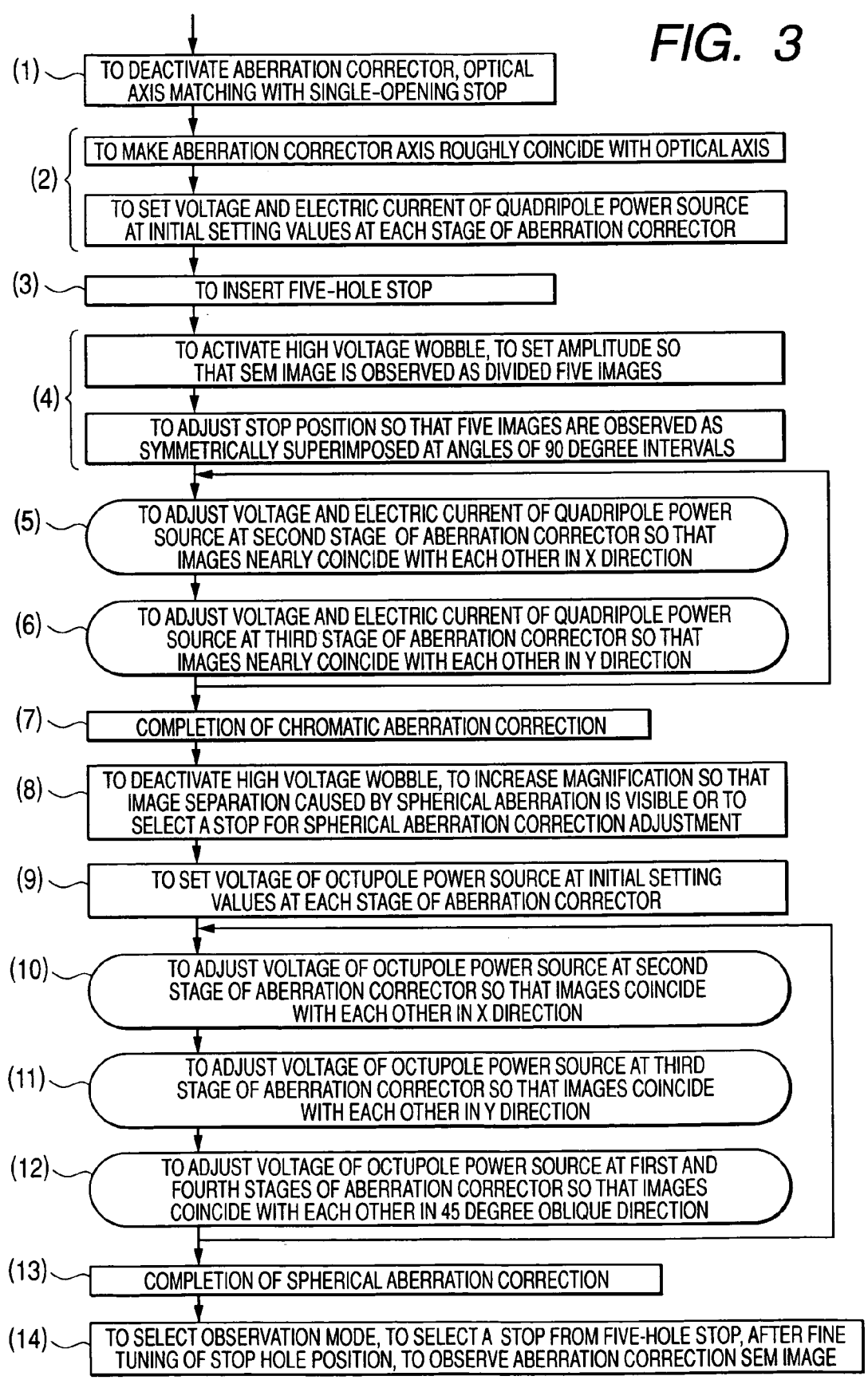
FIG. 3 is a flowchart showing the adjustment of an aberration corrector according to the present invention.

Next, the adjustment procedures of the aberration corrector 10 are explained with the flowchart shown in FIG. 3. Here, the control of aberration correction explained below can also be automated but, unless otherwise noted, it is assumed that the adjustment is manually operated by a device user. Note that, for better understanding, the steps which can be operated by the control computer 30 when automated are shown by the oval frames in the flowchart shown in FIG. 3.

The procedures of the adjustment of the aberration correction in the present embodiment roughly comprise the step of chromatic aberration correction and the step of spherical aberration correction. At the time of the chromatic aberration correction, the adjustment is sometimes carried out by changing the paraxial trajectory of electrons. In that case, the conditions of the spherical aberration correction are changed and hence it is necessary to carry out the chromatic aberration correction in advance. Firstly, the step of the chromatic aberration correction is explained.

(1) Firstly, a series of ordinary axis matching of a SEM is carried out in the state of the deactivation of the aberration corrector. Next, (2) the quadrupole at each stage of the aberration corrector 10 is excited in sequence and the axis of the aberration corrector 10 is made to roughly coincide with the optical axis with the deflector 8 and the scanning deflector 15 so that the beam passes through nearly the center of the quadrupole. In the adjustment of the chromatic aberration correction, the strength of the quadrupole at each stage of the aberration corrector is set at an initial value determined beforehand by calculation or the like so as to create the state wherein images can be observed, and thereafter (3) the five-hole aperture 312 is inserted into the optical axis, and (4), in the state, acceleration voltage is cyclically changed.

In the present embodiment, the control of cyclically applying variable voltage to acceleration voltage is referred to as "high voltage wobble." The image magnification of a SEM in this case is lowered to the extent that the influence of the spherical aberration is not observed. In the case of the high voltage wobble of the present embodiment, AC voltage is applied between the second anode 5 and an earth potential with a high voltage wobbler power source 33. Thereby, the acceleration voltage of the electron beam is modulated at a prescribed cycle and high voltage wobble is realized.

Figure 4:
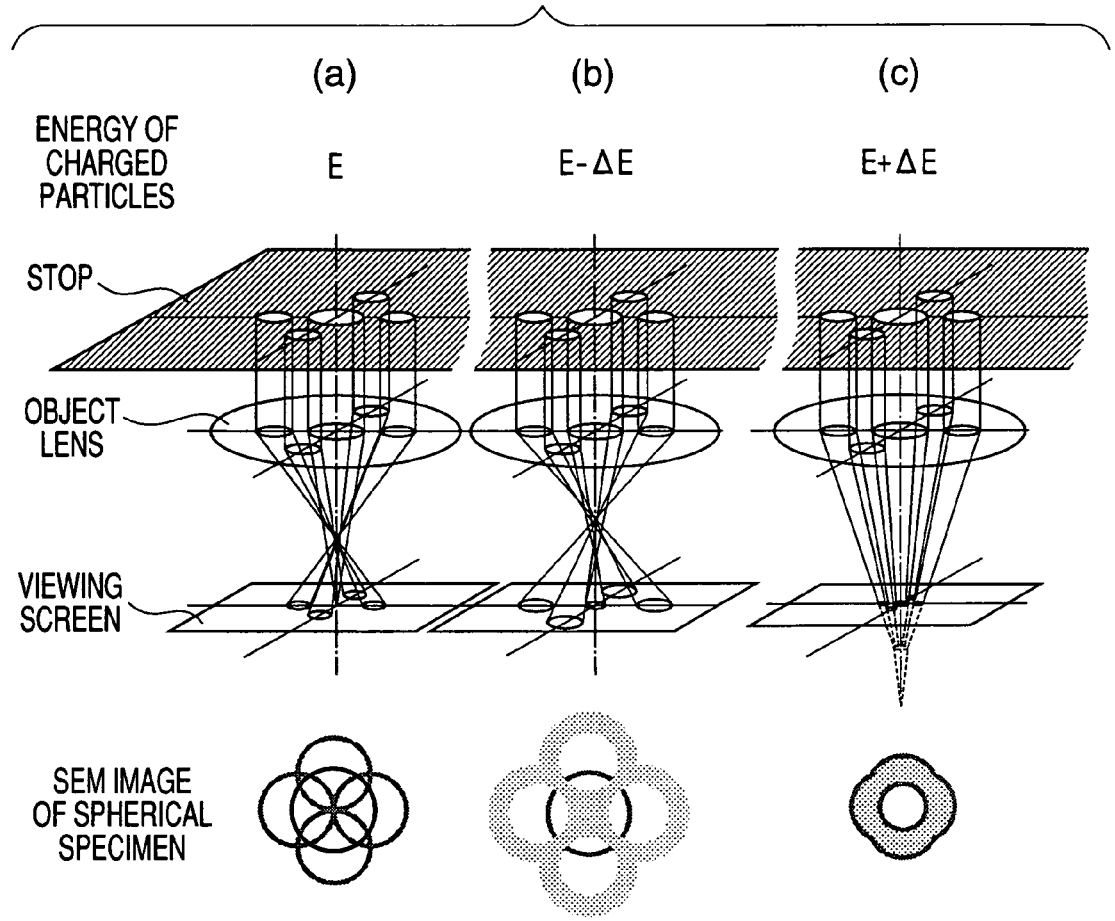
FIGS. 4A to 4C are views explaining SEM images when a five-hole stop is used before chromatic aberration correction.

FIGS. 4A to 4C schematically show how a SEM image displayed on a monitor is varied by the high voltage wobble in the state of inserting the five-hole aperture 312 into the optical axis. The electron beam having passed through the first condenser lens shown in FIG. 1 passes through the five-hole stop, thereby the optical path thereof is separated into five paths, and the separated electron beams are introduced into the object lens. The focal plane moves vertically along the optical axis due to the variation of the acceleration voltage and hence the specimen surface is scanned with five spots between the upper limit and the lower limit of the varying acceleration voltage. As a result, the SEM image is observed as a quintuple image formed by superimposing the center image and the peripheral images located around the center image at angles of 90 degrees as shown in FIGS. 4A to 4C. As a specimen used for the adjustment, a specimen having a symmetrical shape is desirable, in particular a spherical shape is suitable. Here, in the present embodiment, a latex ball is used as the specimen.

FIG. 4A shows the state of not applying variable voltage. Among the electron beams of the five optical paths having passed through the object lens, the electron beam having passed through the center hole is controlled with the object lens so as to form a focus on the viewing screen (on the surface of the specimen 18). Meanwhile, the electron beams of the four peripheral optical paths other than the center optical path form a crossover en route and hit the specimen surface. This is because the focal plane of the electron beams passing through the four peripheral optical paths is different from the focal plane of the electron beam passing through the center optical path. In the case of the present embodiment, the focal plane is formed at the crossover position located on the front side of the specimen, namely on the side of the electron source. As a result, in the SEM image observed in the state shown in FIG. 4A, a sharp (namely, well-focused) ring-shaped image formed by the electron beam having passed through the center hole and four ring-shaped images of blurring profiles (namely somewhat defocused) formed around the periphery thereof are observed.

FIG. 4B is a schematic view of the case where the amplitude of the applied variable voltage is negative. In the figure, the focal plane of the electron beams having passed through the five holes, namely the crossover position, moves toward the object lens. As a result, in the SEM image observed in the state shown in FIG. 4B, the images corresponding to the electron beams having passed through the five holes are observed in the state where the blurring of the focus is larger than that observed in the case shown in FIG. 4A. Further, with regard to the images formed by the electron beams having passed through the four peripheral small holes, the crossover position of the beams becomes farther from the viewing screen and hence the distances between the center position of the ring-shaped image in the center and the center positions of the four peripheral ring-shaped images increase.

FIG. 4C is a schematic view of the case where the amplitude of the applied variable voltage is positive. In the figure, the focal plane of the electron beams having passed through the five holes moves toward the specimen surface. As a result, in the observed SEM image, the blurring of the focus in all the five ring-shaped images becomes larger than that observed in the case shown in FIG. 4A. Further, in the case shown in FIG. 4C, the focal plane moves toward the stage side farther from the specimen and apparently the crossover position is also formed inside the specimen. The crossover position of the four peripheral electron beams also moves toward the stage side farther from the specimen surface and hence, in the observed SEM image, the distances between the center position of the ring-shaped image in the center and the center positions of the four peripheral ring-shaped images decrease.

The width of the deviation of the five ring-shaped images explained above increases in proportion to the amplitude of the high voltage wobble. Further, the aforementioned adjustment procedures of the aberration corrector is based on the premise of manual operation and a device user adjusts the aberration corrector so that the five rings may be superimposed while visually confirming the SEM image with a monitor. Hence, the amplitude of the applied voltage of the high voltage wobbler is set at such a degree of amplitude as to be able to easily observe the deviation of the quintuple image. When the electron beams enter in the state of deviating from the optical axis of the object lens, the whole overlapping image moves not vertically (when the object lens is a magnetic lens) but transversely (to the right, left, top or bottom, or diagonally) and hence it is possible to carry out optical axis matching with a high degree of accuracy by adjusting the position of the stop 31 so that the whole overlapping image may move vertically around the center of the visual field.

Figure 5:
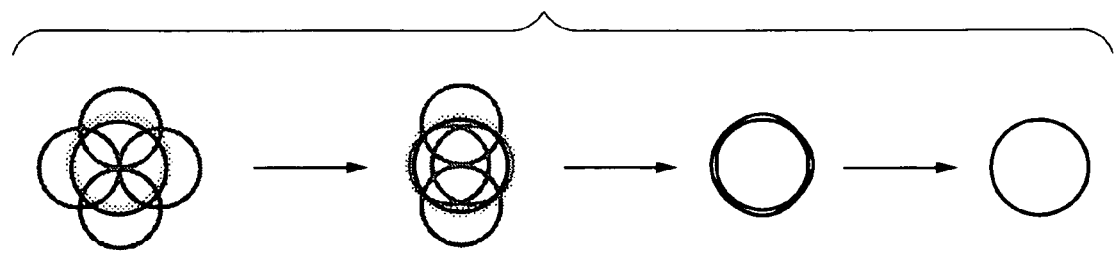
FIG. 5 comprises views explaining SEM images during the process of chromatic aberration correction.

(5) When the chromatic aberration correction is advanced while the ratio of the strengths of the electric field and magnetic field of the quadrupole of the second stage is varied, the SEM image which has been separated and superimposed comes to be superimposed on the center image in a certain direction (regarded as x direction). The process is shown in FIG. 5. The adjustment of the strengths of the electric field and magnetic field is carried out by changing the setting parameters of the aberration corrector power source 26 with the operator console 78 while the device user visually confirms the monitor 77. In this case, by setting the phase of the quadrupole of the aberration corrector beforehand so that the direction of the image deviation in which the SEM image changes may coincide with the direction of the small holes among the five holes (for example, the x direction 313), the operation of the adjustment can be facilitated.

(6) Next, the ratio of the strengths of the electric field and magnetic field of the quadrupole of the third stage is adjusted so that the SEM image which has been separated in the direction orthogonal to the previous direction may be superimposed. The operation is also carried out while the setting parameters of the aberration corrector power source 26 are changed with the operator console 78.

Figure 6:
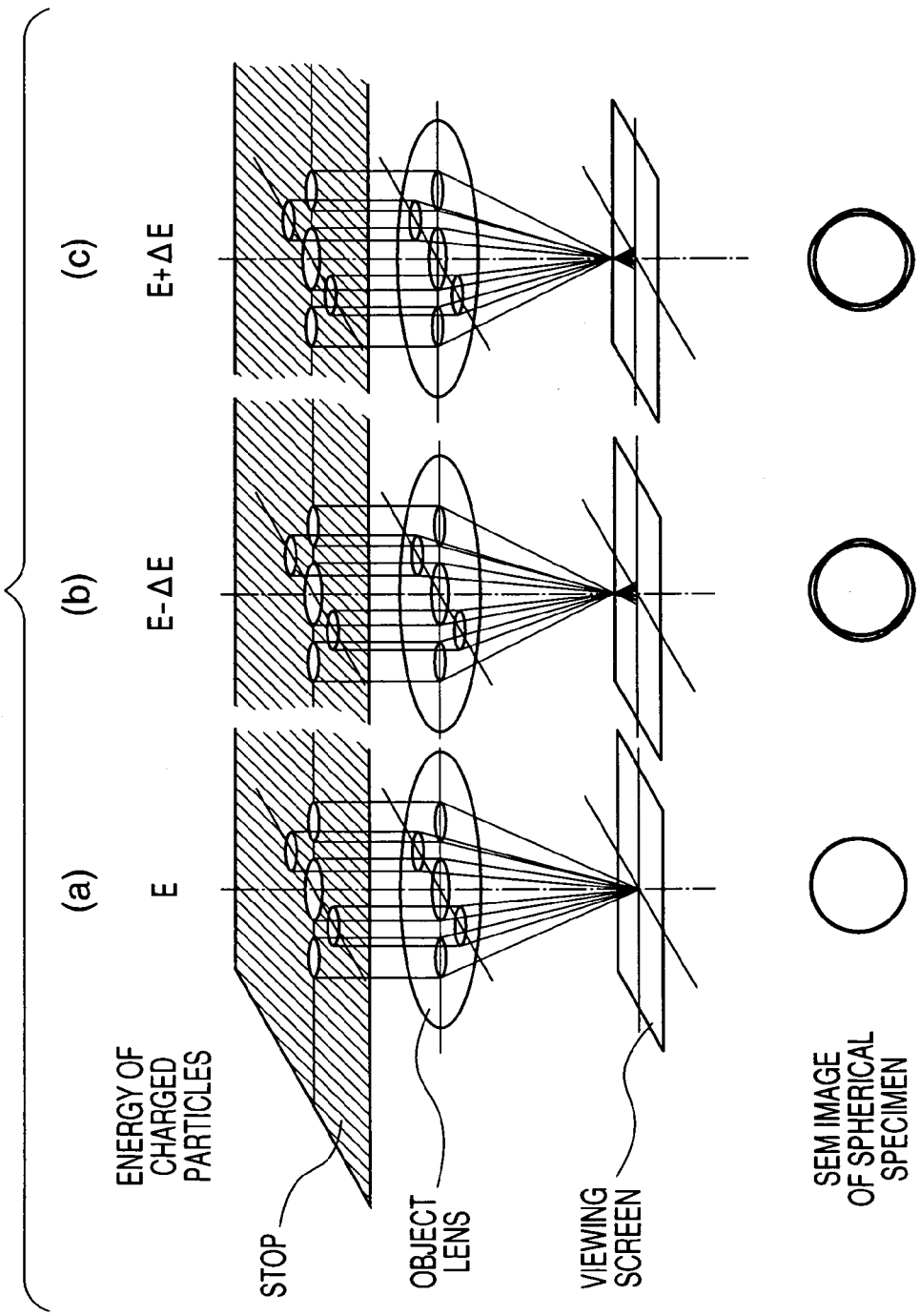
FIGS. 6A to 6C are views explaining SEM images when a five-hole stop is used after chromatic aberration correction.

(7) The above processes are repeated while the amplitude of the high voltage wobble is reduced and the processes terminate when the deviated images come close to the center image evenly in the four directions. FIGS. 6A to 6C show the change of the SEM image caused by the high voltage wobble at the time of the completion of the chromatic aberration correction. The primary chromatic aberration is corrected and the secondary chromatic aberration remains. Hence, the deviation of the electron orbit and the change of the SEM image corresponding to the positive and negative changes of the acceleration voltage show similar tendency in both FIGS. 6B and 6C.

Meanwhile, in the above explanations, the adjustment method of poles by manual operation has been explained. However, automatic adjustment by computer control can also be adopted practically. In order to realize automatic adjustment, the secondary electron images obtained in the adjustment processes of the quadrupole are taken in the control computer 30 in each of the processes (5), (6) and (7) described above and the degree of the overlapping of the images is quantified. As the means, for example, used is an image processing method such as a phase limit correlation method wherein the image of a specimen before the insertion of a multi-hole stop and the images of the specimen obtained in the processes (5), (6) and (7) are subjected to Fourier transformation and phase limit processing, and the matching of them is obtained. A reference table is stored in the data storage 76. Control information obtained as the result of image processing, and the voltage values to be applied to the poles in relation to the control information are compared and stored in the reference table. The control computer 30 refers to the table, and decides and transmits the voltage to be fed back to the aberration correction power source 26. The table may be stored in the computer 30 itself. In order to automate all the adjustment steps, it is necessary to automate all the steps in the flowchart shown in FIG. 3. However, as long as the adjustment of the poles can be automated, the other steps can easily be automated.

Next, the steps of the spherical aberration correction are explained.

(8) The high voltage wobble is deactivated and the magnification is raised until the quintuple SEM image may be observed at in-focus by the influence of the spherical aberration. Otherwise, the movable stop 31 is driven and a five-hole stop having wide spaces between small holes, namely the aperture group 317, is selected so that the quintuple SEM image may easily be observed at in-focus. When the voltage is raised by operating the octupole of the second stage, the spherical aberration is corrected in a direction (tentatively regarded as x direction) and the images come close to the center image. The voltage of the octupole of the second stage is adjusted so that the images coincide with the center image and likewise the voltage of the octupole of the third stage is adjusted so that the images coincide in the orthogonal y direction. Successively, a five-hole stop having small holes the angles of which deviate from the currently-used five-hole stop by 45 degrees, namely the aperture group 318, is inserted and the voltage of the octupoles of the first and fourth stages is adjusted on the basis of the movement of the images in the direction rotationally deviated from the previous direction by 45 degrees. By so doing, the correction of the spherical aberration (aperture aberration) is completed.

In the above adjustment, in the case of the manual adjustment, the device user carries out the above adjustment, in the same way as the chromatic aberration adjustment, by changing the setting parameters of the aberration corrector power source 26 with the operator console 78 while visually observing the monitor 77. Then, in the case of the adjustment by automatic control, in the same way as explained earlier, an appropriate image processing algorithm is used, the degree of the overlapping of the SEM image is quantified, and the poles are controlled so that all the five images are superimposed. Here, though a chromatic and spherical aberration corrector of a quadrupole-octupole type is adopted in the present embodiment, the present invention is not limited to the present embodiment and applicable also to another type of aberration correction means, the process of only the chromatic aberration correction, and the process of only the spherical aberration correction.

Figure 7:
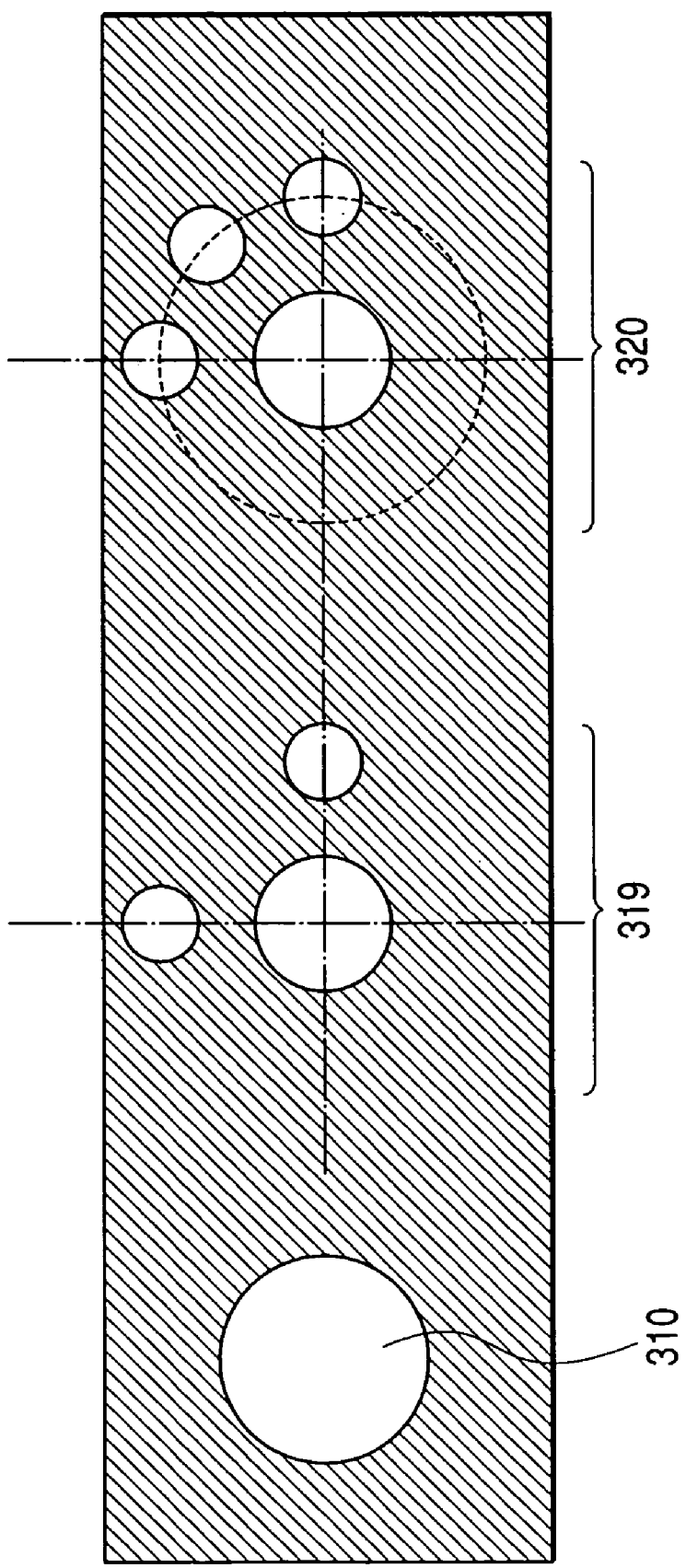
FIG. 7 shows another embodiment of a multi-hole stop.

Then, in the above-explained adjustment method of an aberration corrector, in principle, it is possible to adjust the aberration corrector even when the high voltage wobbler is not applied. The high voltage wobbler is the control which is adopted in order to facilitate the visual confirmation at the time of manual operation and it is also possible to adjust poles so that five ring-shaped images coincide while observing only a SEM image corresponding to FIG. 4A. However, when the high voltage wobbler is used in combination, a SEM image is displayed in the manner of intensifying the degree of aberration and hence there is an effect of facilitating the adjustment. Further, the adjustment is basically possible even when a three-hole stop or a four-hole stop is used as shown in FIG. 7. However, from the viewpoint of visual sense, the use of a stop having small holes disposed fourfold rotationally symmetrically as shown in FIG. 2 makes the adjustment easier.

As stated above, by the means explained in the present embodiment, it is possible to realize an aberration corrector which facilitates adjustment and remarkably improve the operability of a charged particle beam application device having the aberration corrector.

Second Embodiment

The present embodiment is explained on the basis of a case where the present invention is applied to a critical-dimension-measurement SEM (scanning electron microscope). As a specimen for dimension measurement, a semiconductor wafer or a semiconductor chip on which a circuit pattern is formed, or a specimen produced by cutting out a part of the wafer may be adopted.

Figure 8:
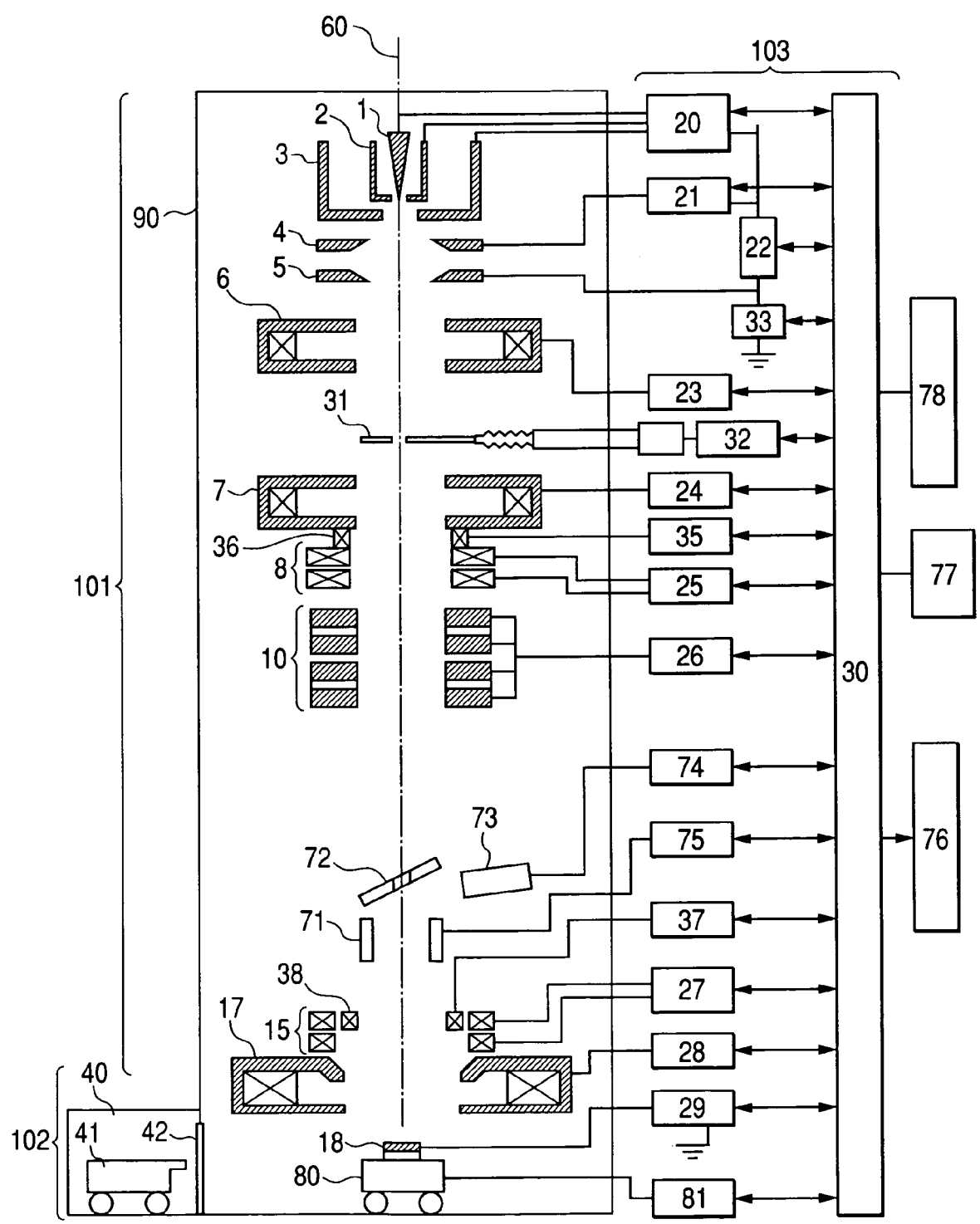
FIG. 8 shows a general configuration of a critical-dimension-measurement SEM to which the present invention is applied.

FIG. 8 shows the configuration of the hardware of a critical-dimension-measurement SEM in the present embodiment. The general configuration of the critical-dimension-measurement SEM is the same as that of the charged particle beam application device explained in the first embodiment in the fact that the critical-dimension-measurement SEM is composed of: a SEM column 101; a specimen chamber 102 to contain a specimen stage; a control unit 103; and others. However, the critical-dimension-measurement SEM has a specimen preparation chamber (load chamber) 40 to introduce a specimen to be subjected to dimension measurement into the device. The specimen preparation chamber 40 and the specimen chamber 102 in the device main body are separated from each other with a gate valve 42 and, when a specimen is introduced into the main body side, the gate valve opens and the specimen is transferred into the specimen chamber in the device main body by a specimen transfer mechanism 41. With regard to the control unit 103 too, though the general configuration is the same as that of the device used in the first embodiment, in the case of the critical-dimension-measurement SEM, the control computer 30 has the functions of: driving the specimen stage in accordance with the recipe which is input beforehand; obtaining an image at a prescribed position on a wafer; applying image analysis to the detected secondary electron image signals; and thus carrying out the prescribed dimension measurement of a line pattern. Here, the electron optics components contained in the SEM column 101 are the same as those in the first embodiment and hence the explanations thereof are omitted.

Figure 9:
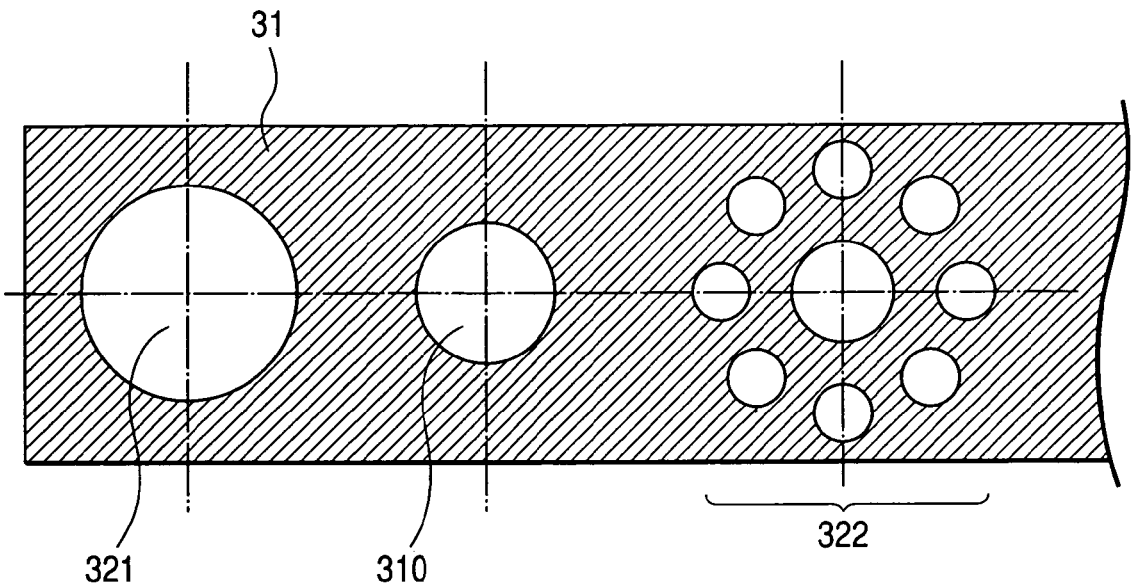
FIG. 9 shows an example of a movable stop having round apertures and a nine-hole aperture according to the present invention.

The operation of the electron optics system is essentially the same as that of the charged particle beam device in the first embodiment and the adjustment operation of the aberration corrector and the operation of alignment are carried out through the procedures explained in the first embodiment. However, in the case of the critical-dimension-measurement SEM, automatic operation is dominant and hence the operation of the movable stop 31 is automated. In each of the processes shown in FIG. 3, the control computer 30: judges the orientation of the overlapping of images and the symmetry at angles of 90 degrees; commands the movable stop micromotion mechanism 32 to drive the air-pressuring mechanism, the pulse motor and others; and thus carries out the selection from among plural stops and the position micromotion. It is possible to detect a notch and a marking of a stop and control the position of the stop. That is, in the flowchart shown in FIG. 3, automated are the steps of: the insertion of a stop for chromatic aberration correction; the position adjustment of a stop for chromatic aberration correction; the selection and insertion of a stop for spherical aberration correction; and the switching from a multi-hole stop to a single-hole stop. Other adjustment steps, namely the primary setting of the voltage and electric current of a quadrupole power source, the setting of the amplitude of the applied voltage of the high voltage wobble and others, can be automated by setting a reference table or the like. In the present embodiment, it is preferable to use such a nine-hole stop as shown by the reference numeral 322 in FIG. 9. This is because, at the time of chromatic and spherical aberration correction, it is possible to carry out the correction in the directions at angles of 45 degrees in relation to the correction in the x and y directions with only one multi-hole stop. In other words, by using a nine-hole stop, it is possible to save the time spent for the change of a stop and shorten the time required for device adjustment. Since the critical-dimension-measurement SEM is used as an in-line measuring device, it is important for the device to increase the throughput as much as possible. Therefore, by shortening the time for the device adjustment, it is possible to increase the device operation time per day and improve the cost advantage for a device user.

When a critical-dimension-measurement SEM is equipped with an aberration corrector, the chromatic and spherical aberrations of the electron lens system (the object lens in particular) are cancelled and hence the resolution of the obtained SEM image improves. Thereby it becomes possible to use a beam having a large aperture angle, which has heretofore been restricted because of the spherical and chromatic aberrations, for probe formation. However, the focal depth decreases inversely as shown by the following expression.

$$DOF \sim dp/2\alpha \qquad (1),$$

where, DOF represents a focal depth, dp a probe diameter, and α a beam aperture angle (semi-angle).

In a semiconductor circuit which is a typical measuring object specimen of a critical-dimension-measurement SEM, the circuit pattern formed on a substrate is multi-layered and further the pattern itself has some degrees of jogs. Hence, a SEM image used for the dimension measurement of a pattern has to be focused at least on the layer to be subjected to the dimension measurement. Therefore, it is also necessary to cope with such a problem that the focal depth decreases when the chromatic and spherical aberrations are corrected.

As a prior art aimed at the improvement of resolution and the increase of a focal depth in the field of electron beam application devices, JP-A 124205/2002 discloses a technology of using an orbicular zone light stop, thus cutting an electron beam in the vicinity of an optical axis, and preventing the focal depth from deteriorating. The reason why the focal depth is prevented from deteriorating by cutting the electron beam in the vicinity of an optical axis is briefly explained below. When the electron beams having passed through an orbicular zone light stop are converged in the vicinity of a focus with an object lens, any of the electron beams enters the vicinity of the focus at almost the same angle to the optical axis. If the wave nature of electrons is taken into consideration, by the interference of an electron wave group forming an identical angle with the optical axis, the probability of the existence of electrons on a plane group parallel with the optical axis increases. When the probability is integrated around the optical axis, the field where the probability of the existence of electrons increases extends backward and forward around the focal point in the center along the optical axis. In other words, the focal depth increases. In contrast, when the beam in the vicinity of the center is not cut, the probability of the existence of electrons on the plane group obliquely intersecting with the optical axis increases in the case of the interference between the center beam and the beams from the periphery of the stop. When the probability is integrated around the optical axis, the phenomenon wherein they are compensated with each other and thus the probability of the existence of electrons increases occurs only in the vicinity of the focus position and the focal depth becomes smaller than the case of the orbicular zone light. However, the document does not disclose the means for correcting the chromatic and spherical aberrations. The focus position of the center beam is different from that of the peripheral beams due to the spherical aberration and hence, when the stop is changed from an ordinary round single-hole stop to an orbicular zone aperture stop, focus deviation occurs and the focus position needs to be moved. Then, even though the focus position is moved, the chromatic aberration is not corrected, thus the spots are in the state of separation, and therefore the obtained image is an overlapped image similar to the one shown in FIG. 4A. Therefore, the application of the above prior art is limited.

Figure 10:
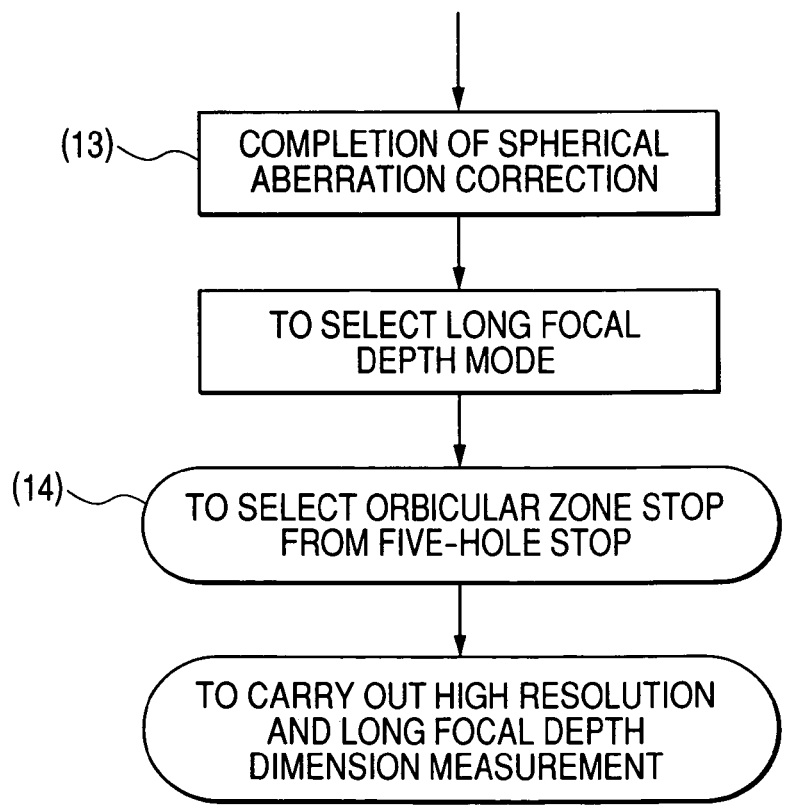
FIG. 10 is a flowchart explaining a long focal depth mode according to the present invention.

In view of the above situation, in the critical-dimension-measurement SEM of the present embodiment, the device is designed so that the device may have the function of being operable in both the long focal depth mode and the aberration correction mode and a device user may select either of the modes. FIG. 10 shows a flowchart of the operation of the device in the operation flow after spherical aberration correction. When the step of the end of the spherical aberration correction is terminated in the flowchart shown in FIG. 7, an icon for selecting either the long focal depth mode or the aberration correction mode is exhibited on the monitor 77 shown in FIG. 8 and a device user selects either of them. When a user selects the long focal depth mode, by the instruction of the control computer 30, the movable stop micromotion mechanism 32 moves the eight-hole aperture 323 shown in FIG. 11 (pseudo orbicular zone aperture since a shield cannot be placed on the optical axis without a support in the case of a charged particle beam) onto the optical path. Thereby, the focal depth increases by the multiple, which is defined by the expression below, of that in the case of a round hole stop.

$$1/\{1-(a'/a)^2\} \quad (2),$$

where, a represents the outer radius of a pseudo orbicular zone aperture, and a' represents the inner radius of the pseudo orbicular zone aperture. In this case, since it is after the correction of the chromatic and spherical aberrations, as long as the center position of the stop is restored, the deviation of a focus and the shift of an image do not occur. By so doing, it is possible to lessen the decrease of the focal depth caused when an aberration corrector is used and also improve the operability and quality of the SEM image at focusing. In contrast, in the case of the aberration correction mode, a high resolution image can be obtained by aberration correction but the beam aperture angle increases and thus the focal depth decreases. In the case of the long focal depth mode, in the automated dimension-measurement image processing, as long as the focus is well converged in the vicinity of the position where the dimension measurement is carried out, the focus is also well converged at the position where the dimension measurement is carried out due to the long focal depth and the dimension-measurement image processing does not stop and rather advances. Since it is not necessary to manually adjust the focus again, the ratio of automated dimension measurement improves, and also the throughput improves. Meanwhile, when the close observation of the roughness and shape of a pattern is desired, a high resolution image can be obtained by adjusting the focus to the position to be observed with the aberration correction mode. Therefore, in the critical-dimension-measurement SEM, by allocating the long focal depth mode and the aberration correction mode to the automated dimension measurement and the image observation respectively, the advantage of obtaining high degrees of performances (high throughput and high image quality) of the device can be obtained.

Figure 11:
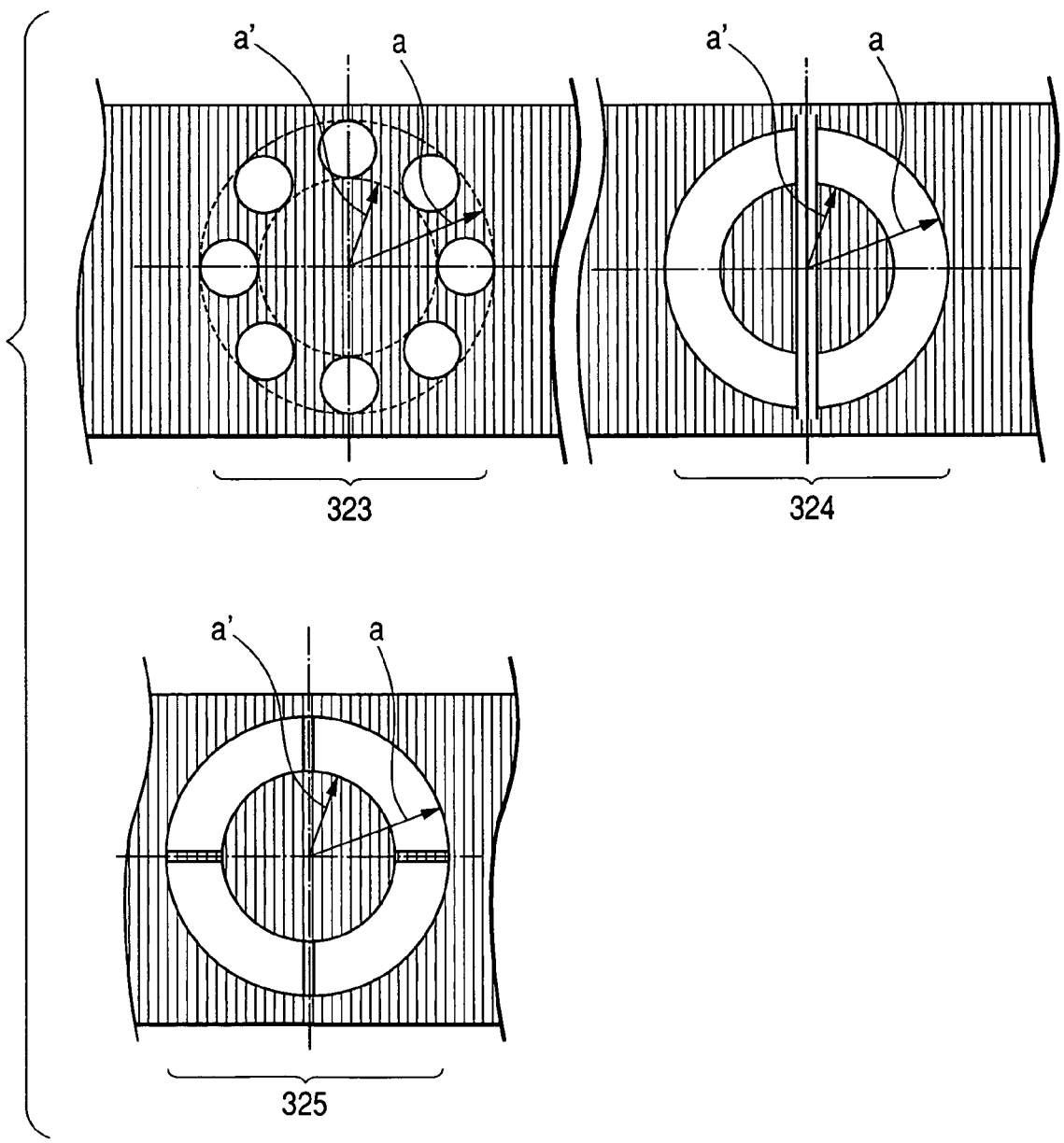
FIG. 11 shows examples of orbicular zone stops.

Examples of other orbicular zone apertures are shown as the reference numerals 324 and 325 in FIG. 11. In those cases, the branch portions are few and the opening ratio is large in comparison with the orbicular zone aperture of the reference numeral 323 and hence the probe electric current is reduced only by about $\{1-(a'/a)^2\}$ times that of a single round aperture having the radius a and it is possible to carry out dimension measurement of a high resolution long focal depth which less deteriorates the brightness.

The present invention is applicable to a scanning electron microscope, a semiconductor inspector, a scanning transmission electron microscope, a focused ion beam device and the like.

What is claimed is:
1. A charged particle beam application device comprising:
   a specimen stage on which a specimen is mounted;
   an irradiation optical system to scan said specimen mounted on said specimen stage with a primary charged particle beam;
   a detector to detect secondary charged particles generated by the scanning with said charged particle beam; and a display means to display the output signals from said detector in the form of images, wherein said irradiation optical system comprises:

an aberration corrector to correct the aberration of said incoming primary charged particle beam; and a means for dividing an optical path of either said primary charged particle beam entering said aberration corrector or said primary charged particle beam having passed through said aberration corrector into plural optical paths.

2. A charged particle beam application device according to claim 1, wherein said means for dividing the optical path of said primary charged particle beam into plural optical paths is a stop having plural openings.

3. A charged particle beam application device according to claim 1, wherein said stop has a first aperture group having plural openings through which said primary charged particle beam divided into said plural optical paths passes, and wherein said first aperture group has a first opening, and plural second openings disposed symetrically around a center axis of said first opening.

4. A charged particle beam application device according to claim 3, wherein said irradiation optical system has a high-voltage wobbler function.

5. A charged particle beam application device according to claim 3, wherein said plural second openings include at least two openings disposed at the positions twofold rotationally symmetrical around the center of said first opening.

6. A charged particle beam application device according to claim 3, wherein said plural second openings include at least two openings disposed at the positions either fourfold rotationally symmetrical or eightfold rotationally symmetrical around the center of said first opening.

7. A charged particle beam application device according to claim 3, wherein said stop has a third opening disposed in addition to said first aperture group.

8. A charged particle beam application device according to claim 7, including a stop moving means of retracting either said first aperture group or said third opening from the optical axis of said primary charged particle beam.

9. A charged particle beam application device according to claim 8, including a control means for controlling said stop moving means, wherein said display means is connected to said control means, and wherein an icon to select any of said first aperture group, said second aperture group, and said third opening is displayed on said display means.

10. A charged particle beam application device according to claim 8, including:

a control means for controlling said stop moving means; and an input means for selecting any of said first aperture group, said second aperture group, and said third opening.

11. A charged particle beam application device comprising:

a specimen stage on which a specimen is mounted;

an irradiation optical system to scan said specimen mounted on said specimen stage with a primary charged particle beam;

a detector to detect secondary charged particles generated by the scanning with said charged particle beam; and a display means to display the output signals from said detector in the form of images, wherein said irradiation optical system comprises:

a charged particle beam source;

an aberration corrector to correct the aberration of said incoming primary charged particle beam; and a stop disposed between said charged particle beam source and said aberration corrector, and wherein said stop has a first opening disposed on an optical axis of the primary charged particles emitted from said charged particle beam source, and plural second openings disposed symmetrically around a center axis of said first opening.

12. A charged particle beam application device according to claim 11, wherein said charged particle beam source is an electron source.

13. A wafer inspection device using a charged particle beam application device according to any one of the claims 1 to 8 and 9 to 12, said wafer inspection device comprising a means for judging existence or nonexistence of defect in said specimen on the basis of the output signals of said detector.

14. A critical-dimension-measurement device using a charged particle beam application device according to any one of the claims 1 to 8 and 9 to 12, said critical-dimension-measurement device comprising a means for measuring the dimension of a pattern formed on said specimen on the basis of the output signals of said detector.

15. A charged particle beam application device comprising:

a specimen stage on which a specimen is mounted;

an irradiation optical system to scan said specimen mounted on said specimen stage with a primary charged particle beam;

a detector to detect secondary charged particles generated by the scanning with said primary charged particle beam; and a display means to display the output signals from said detector in the form of images, wherein said irradiation optical system comprises:

an aberration corrector to correct the aberration of said incoming primary charged particle beam; and a first stop for dividing an optical path of either said primary charged particle beam entering said aberration corrector or said primary charged particle beam having passed through said aberration corrector into plural optical paths.

16. A charged particle beam application device according to claim 15 further comprising a second stop having an orbicular zone aperture and a shield from the primary charged particle beam arranged in the center of the orbicular zone.

17. A charged particle beam application device according to claim 16, further comprising a means for switching said first stop and said second stop.

18. A charged particle beam application device according to claim 16, wherein the orbicular zone aperture comprises a plurality of round apertures.

19. A wafer inspection device using a charged particle beam application device according to any one of the claims 15 and 16 to 18, said wafer inspection device comprising a means for judging existence or nonexistence of defect in said specimen on the basis of the output signals of said detector.

20. A critical-dimension-measurement device using a charged particle beam application device according to any one of the claims 15 and 16 to 18, said critical-dimension-measurement device comprising a means for measuring the dimension of a pattern formed on said specimen on the basis of the output signals of said detector.

* * * * *